United States Patent

Masumoto

[11] Patent Number: 5,801,995
[45] Date of Patent: Sep. 1, 1998

[54] OPTION SETTING CIRCUIT AND AN INTEGRATED CIRCUIT APPARATUS INCLUDING THE OPTION SETTING CIRCUIT

[75] Inventor: Hiroaki Masumoto, Kyoto, Japan

[73] Assignee: Rohm Co., Ltd., Kyoto, Japan

[21] Appl. No.: 241,669

[22] Filed: May 12, 1994

Related U.S. Application Data

[63] Continuation of Ser. No. 957,838, Oct. 8, 1992, abandoned.

[30] Foreign Application Priority Data

Oct. 9, 1991 [JP] Japan ................ 3-290966

[51] Int. Cl.$^6$ ................ G11C 7/00
[52] U.S. Cl. ................ 365/189.05; 365/189.04; 365/230.08
[58] Field of Search ............ 365/189.05, 230.08, 365/189.04

[56] References Cited

U.S. PATENT DOCUMENTS 4,849,937  7/1989  Yoshimoto ................ 365/189.05
4,887,242  12/1989  Hashimoto ................ 365/189.05 X
4,894,803  1/1990  Aizaki ................ 365/189.05
5,003,510  3/1991  Kamisaki ................ 365/189.05 X
5,043,944  8/1991  Nakamura et al. ................ 365/230.08 X
5,136,546  8/1992  Fukuda et al. ................ 365/189.05 X
5,204,841  4/1993  Chappell et al. ................ 365/230.08 X

FOREIGN PATENT DOCUMENTS 2 633 410  12/1989  France.

OTHER PUBLICATIONS

Patent Abstracts of Japan, vol. 14, No. 78 (P-1006), Feb. 14, 1990, and JP-A-12 93 414, Nov. 27, 1989.

*Primary Examiner*—Do Hyun Yoo
*Attorney, Agent, or Firm*—Nikaido, Marmelstein, Murray & Oram LLP

[57] ABSTRACT

An option setting circuit includes a set circuit with respect to which an option is set, a non-volatile memory for storing an option data for setting the set circuit which memory is provided exclusively for the set circuit, and a latch circuit which latches an option data provided from the non-volatile memory and provides the data to the set circuit.

8 Claims, 4 Drawing Sheets

OPTION SETTING CIRCUIT AND AN INTEGRATED CIRCUIT APPARATUS INCLUDING THE OPTION SETTING CIRCUIT

This application is a continuation of application Ser. No. 07/957,838 filed Oct. 8, 1992, now abandoned.

BACKGROUND OF THE INVENTION

1. Field of the Invention

The present invention relates to an option setting circuit and an integrated circuit apparatus for use in a one-chip microcomputer.

2. Description of the Prior Art

Interface circuits such as one-chip microcomputers are provided with option setting circuits. This is because there are occasions where options are changed in accordance with the arrangements of peripheral integrated circuits (ICs) and discrete parts. Option setting circuits are also used for changing options when specifications are changed in developing a system for an IC chip for evaluating an application program for a one-chip microcomputer.

FIG. 1 shows an example of conventional option setting circuits. An I/O (input/output) circuit 1a is provided with an invertor 2a and a p-channel MOS (metal oxide semiconductor) transistor 4a for pulling up an input of the invertor 2a to a power supply line 3. When an input terminal of the invertor 2a is connected to an external switching circuit through an input pad 5a, if the switching circuit is a CMOS (complementary metal oxide semiconductor), it is unnecessary to pull up the input terminal of the invertor 2a to the power supply line 3. This is because signals having a value of 0 and signals having a value of 1 are produced by the switching circuit and input. Therefore, the transistor 4a is set to an OFF state.

However, if the switching circuit consists only of an n-channel MOS transistor, since only "0" signals are input to the input pad 5a, it is required to produce "1" signals at the I/O circuit 1a. Therefore, in that case, it is necessary that the transistor 4a always be ON. When the transistor 4a is ON, if the external switching circuit is OFF, an input of the invertor 2a is 1 (a VDD voltage of the power supply line 3), and if the external switching circuit is ON, the input of the invertor 2a is 0 since "0" signals are input. In FIG. 1, numeral 6a is a resistor and numeral 7a is a protecting circuit consisting of diodes D1 and D2.

In setting whether to an set the transistor 4a to an ON state or to an OFF state (that is, in setting an option), an option data ROM (read only memory) 11 and an option latch circuit 8a are simultaneously opened when the level of an address data bus line 9 is changed to low by a specified address data of this option. As a result, an option data is input from the option data ROM 11 to the option latch circuit 8a through a data bus line 10.

The option data ROM 11 and the option latch circuit 8a are simultaneously closed when the address data bus line 9 is changed to an address data other than the specified address data of this option. As a result, data transfer is stopped.

The ROM address of the option data ROM 11 is arranged as shown in FIG. 2. An option setting data ROM area 13 is allotted in an extension of a program data ROM area 12. Assuming that the option setting data ROM area 13 starts at address 2000 and that the address data thereof is used for setting an option of the I/O circuit 1a, option setting for another I/O circuit (such as shown in 1b... 1n) is performed based on a data at address 2001 which is the next address on the address data bus line 9. Thereafter, option setting is made in a similar manner for a plurality of portions relating to the microcomputer.

The above-described conventional option setting circuit offers the following problem: Since a data stored in the option latch circuit 8a is erased when the power of an IC is turned off, it is required to read out a data from the option data ROM 11 and store the data in the option latch circuit 8a every time the power is turned on. For this reason, it takes a long time to set all the options 8a, 8b, ... 8n if tens of options are provided. As a result, a period of time exists in which an option condition is being set which is different from an option condition that is set immediately after the power is turned on. Erroneous operation is performed during this period of time.

SUMMARY OF THE INVENTION

An object of the present invention is to provide an option setting circuit designed so that no different option condition exists after the power is turned on even if a large number of options are provided.

An option setting circuit for use in an integrated circuit apparatus according to the present invention is provided with a set circuit with respect to which an option is set, a non-volatile memory for storing an option data for setting the set circuit which memory is provided exclusively for the set circuit, and a latch circuit which latches an option data provided from the non-volatile memory and provides the data to the set circuit.

With such a feature, an option which has been set is not erased after the power is turned off and remains therein until another option is set, and a plurality of options are automatically, simultaneously set based on an output of the non-volatile memory corresponding to each option. Since all the options are simultaneously set immediately after the power is turned on as described above, no different option condition exists. As a result, the IC never erroneously operates.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
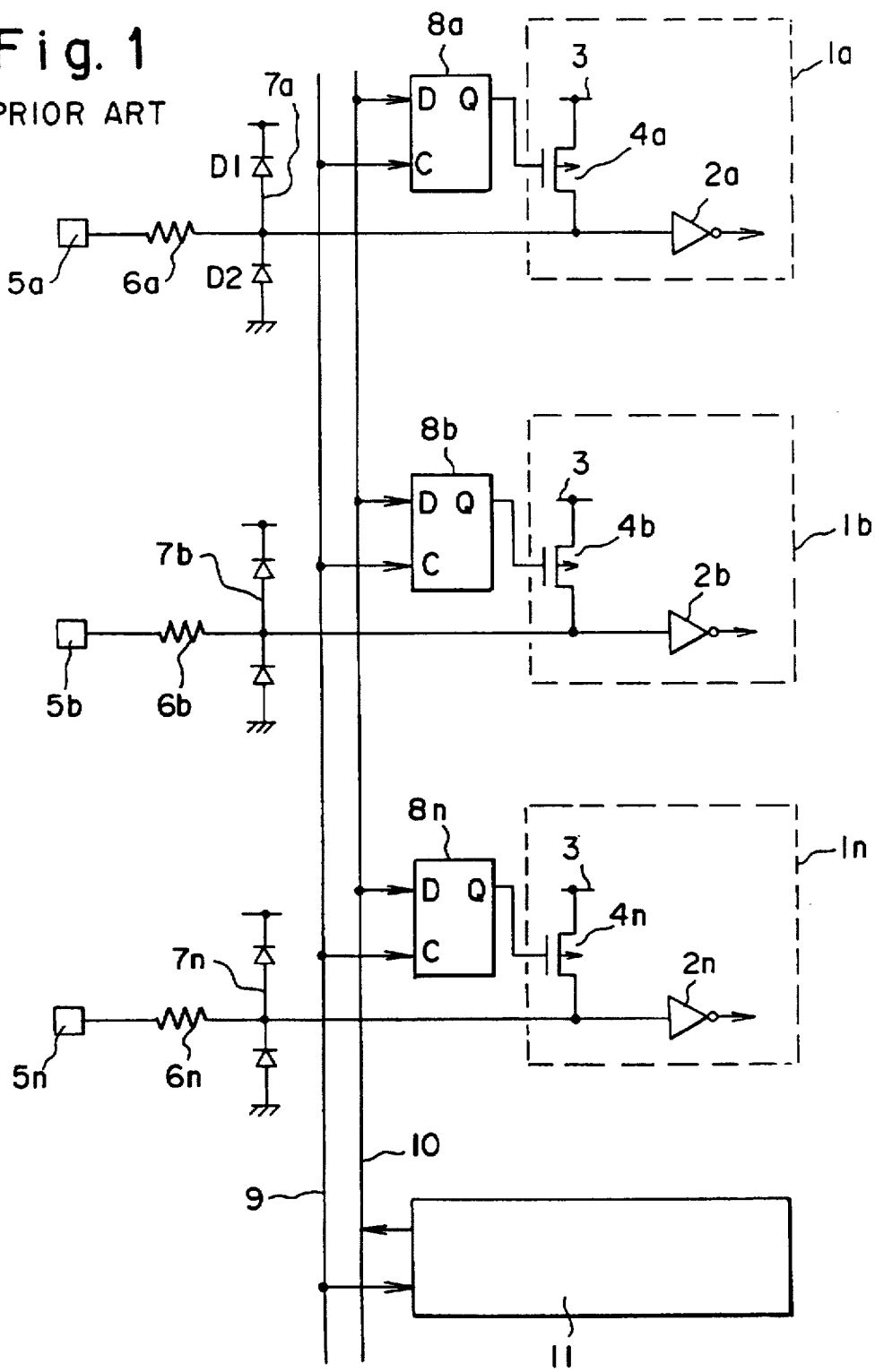
FIG. 1 is a circuit diagram showing a conventional option setting circuit which is employed for an I/O circuit.
Figure 2:
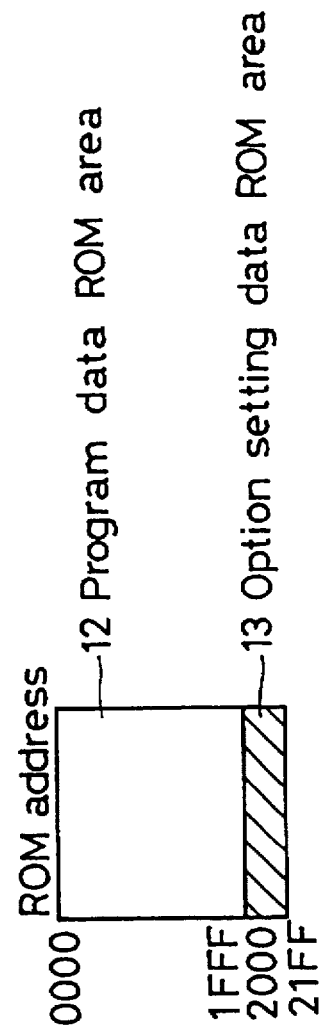
FIG. 2 is a view for explaining an operation of the circuit of FIG. 1.
Figure 3:
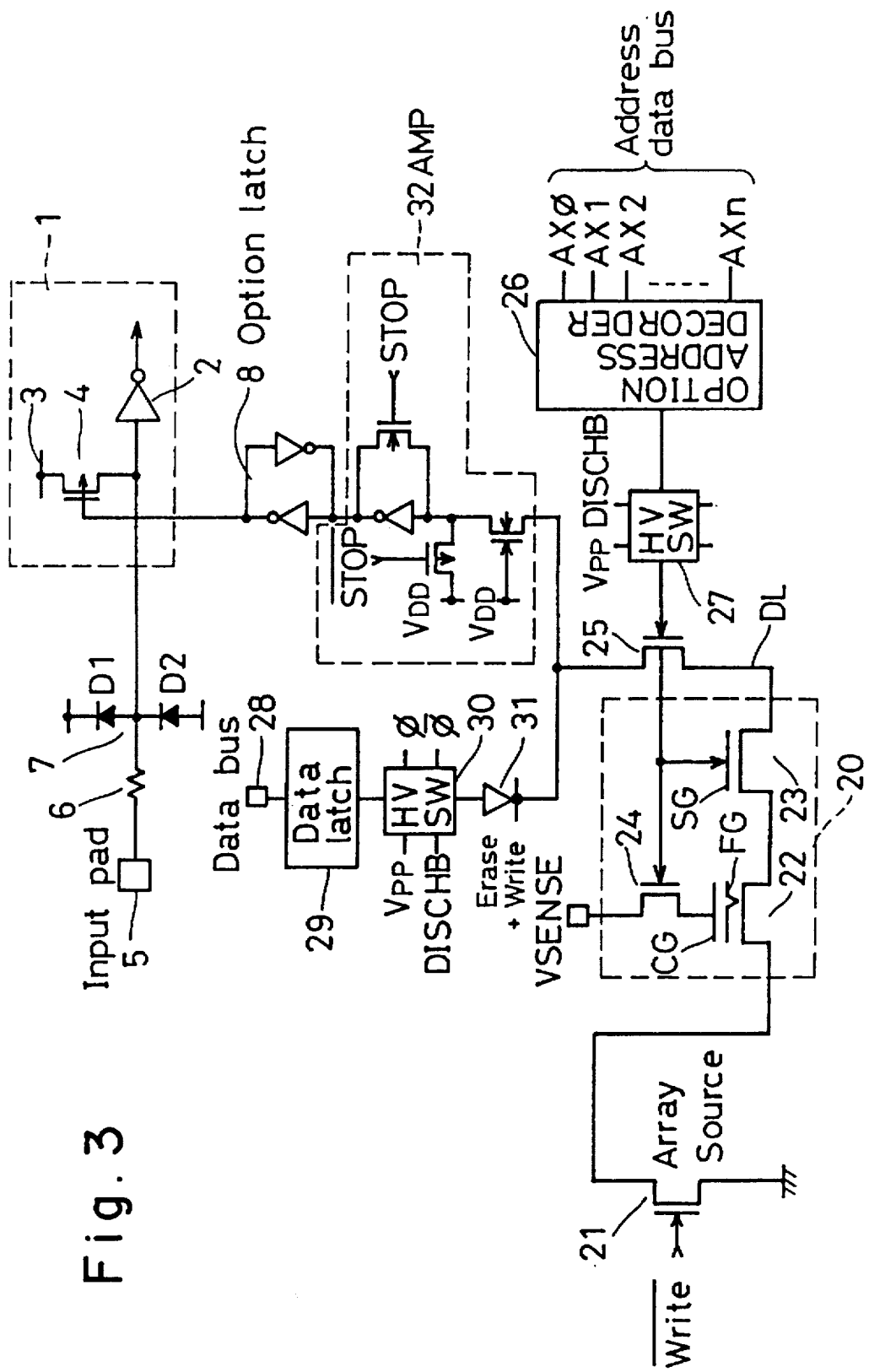
FIG. 3 is a circuit diagram showing a part of an option setting circuit for use in an integrated circuit apparatus embodying the present invention.

FIG. 3 shows an option setting circuit embodying the present invention. Portions the same as those of the conventional option setting circuit of FIG. 1 are denoted by the same reference designations. In this embodiment, each of the circuits for which option setting is to be made is provided with an option setting memory of its own. Since a data is previously written into the memory, it is only necessary to provide an output of the memory to an option latch circuit when the power is turned on.

Numeral 20 is a non-volatile option setting memory, which is an E²PROM (electrically erasable programmable read only memory), including a memory transistor 22 and a selecting transistor 23. To the option setting memory 20, an array source transistor 21 and transistors 24 and 25 as shown in the figure are connected. Concerning the memory 20 and transistors 21, 24 and 25, although only one of each is shown in FIG. 3, they are provided in the number corresponding to the number of options in the actual option setting circuit of this embodiment.

Numeral 26 is an option address decoder for specifying an address in writing a data into the memory 20. The option address decoder 26 decodes an address signal provided through address data buses AXo to AXn, and outputs a signal for specifying a memory. The output is applied to the gates of the transistors 23, 24 and 25 of a predetermined memory 20 through a high-voltage switching circuit 27, since a high voltage is required for writing a data into the memory 20 which is an E²PROM (and for erasing a data therefrom).

Assume now that the memory 20 shown in the figure is specified as a memory into which a data is to be written, the data is transmitted to a data line DL via a data bus 28, a data latch circuit 29, a high-voltage switching circuit 30, an invertor 31 and the transistor 25, and then is written into the memory 20. During the data writing, the array source transistor 21 is OFF (open).

An option data is previously written as described above and stored in the memory 20. This data storing is successively performed in a similar manner for all the memories which are not shown in the figure. When the power is turned on to activate the IC, a data is output from the memory 20 through the transistor 25, and the data is provided to the option latch circuit 8 through an amplifying circuit 32. When the power is turned off, although the data provided to the option latch circuit 8 is erased, the data stored in the memory 20 is not erased. When the power is turned on again, the data is immediately output and latched by the option latch circuit 8.

When the power is turned on again, the option address decoder 26 is deactivated. At this time, the high-voltage switching circuit 27 outputs a 5 V voltage. The 5 V voltage is an operation voltage VDD for ordinary integrated circuits. The 5 V voltage is applied to the gates of the transistors 23, 24 and 25. Then, the data line DL is coupled to the amplifying circuit 32 by the transistor 25's being activated, so that a data stored in the memory 20 is provided to the option latch circuit 8 through the amplifying circuit 32. As a result, the I/O circuit is set in accordance with the data stored in the memory 20. At the time of the above-described data reading out which accompanies the turning on of the power, naturally, no data to be written are present in the data bus, and the data latch circuit 29, the high-voltage switching circuit 30 and the invertor 31 are under OFF state.

As previously mentioned, although only one I/O circuit 1 and the memory 20 corresponding thereto are shown in FIG. 3 for simplicity, they are provided in a plurality of numbers in accordance with the number of options. Each of the other options is also set by reading out a data from a memory when the power is turned on and then latching the data with a corresponding latch circuit. Thus, a plurality of options are simultaneously set.

Figure 4:
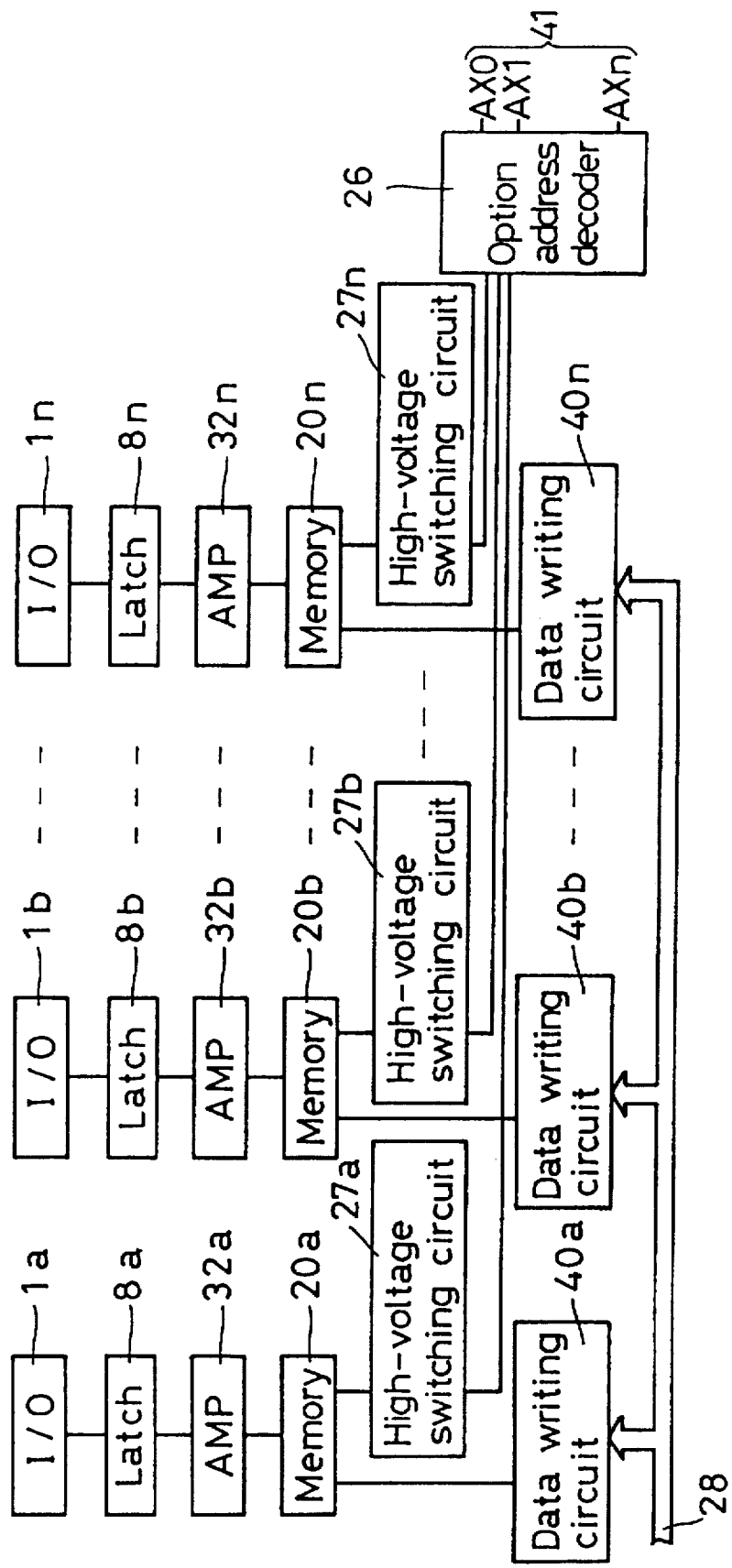
FIG. 4 is a general block diagram of an option setting circuit for use in an integrated circuit apparatus embodying the present invention.

FIG. 4 is a block diagram showing an option setting circuit where a plurality of options are set in the above-mentioned manner. Designations 1a, 1b, . . . , 1n are a plurality of I/O circuits with respect to which options are to be set. Designations 8a, 8b. . . , 8n are option latch circuits connected to the I/O circuits 1a, 1b, . . . , 1n, respectively. Designations 32a, 32b, . . . , 32n are amplifying circuits. Designations 20a, 20b, . . . , 20n, are option setting memories constituted by non-volatile memories. Designations 40a, 40b, . . . , 40n, are data writing circuits including the data latch circuit 29, the high-voltage switching circuit 30 and the diode 31 of FIG. 3.

At the time of data writing, an address data provided through an address data bus 41 is decoded by the option address decoder 26 to sequentially turn on high-voltage switching circuits 27a, 27b, . . . , 27n one by one. The data writing circuits 40a, 40b, . . . , 40n, latch data provided through the data writing data bus 28 and provides written data to the memories 20a, 20b, . . . , 20n. The written data are provided to memories to which a high voltage of 20 V is applied. The high-voltage switching circuit 27a, 27b, . . . , 27n are sequentially turned on one by one. Accompanying this, the data are sequentially written to the memories 20a, 20b, . . . , 20n, one by one. The data written into the memories 20a, 20b, . . . , 20n, are retained after the power is turned off. When the power is turned on again, the data stored in the memories 20a, 20b, . . . , 20n, are simultaneously output to set options with respect to corresponding I/O circuits 1a, 1b, . . . , 1n. The circuit of FIG. 4 is constructed as one integrated circuit apparatus.

Since a plurality of options are simultaneously set when the power is turned on, no different option condition exists. As a result, the IC circuit never erroneously operates.

The following table shows, with respect to the memory 20, the contents of the data line DL, a select gate SG of the selecting transistor 23, a control gate CG of the memory transistor 22, and the array source transistor 21 in each of a read, an erase and a write modes.

| Mode | Data Line | Select Gate | Control Gate | Array Source |
|---|---|---|---|---|
| Read | — | $V_{DD}$ | Sense Voltage | 0V |
| Erase | 0V | $V_{PP}$ | $V_{PP}$ | 0V |
| Write | $V_{PP}$ | $V_{PP}$ | 0V | Open |

Obviously, many modifications and variations of the present invention are possible in light of the above teachings. It is therefore to be understood that within the scope of the appended claims, the invention may be practiced other than as specifically described.

What is claimed is:

1. An option setting circuit for selectively setting a condition of an input/output circuit outputting a first signal having a value of 1 and a second signal having a value of 0 in accordance with an input signal, said option setting circuit comprising:

a transistor provided in said input/output circuit;
   a non-volatile memory storing option data only for said transistor, said option data showing whether said transistor is activated or disabled, said non-volatile memory storing said option data even after power is turned OFF and said non-volatile memory outputting the option data when the power is turned ON; and
   a latch means, connected between said non-volatile memory and said transistor, for latching the option data supplied from the non-volatile memory when the power is turned ON and for supplying the latched data to the transistor while the power is ON, wherein a plurality of said circuits, transistors, non-volatile memories and latch means are provided in groups, and wherein each group of said circuit, transistor, non-volatile memory and latch means is formed separately of one another, and wherein the option data is simultaneously supplied to the latch means of each group from the non-volatile memory of each group.

2. An option setting circuit according to claim 1, further comprising a plurality of writing data providing circuits each connected to the non-volatile memory, for providing the option data to the non-volatile memory.

3. An option setting circuit according to claim 2, further comprising an address decoder connected to the plurality of non-volatile memories, for providing an address data to each of the non-volatile memories in a writing operation.

4. An option setting circuit according to claim 1, further comprising a writing circuit for writing the option data to said non-volatile memory.

5. An option setting circuit according to claim 1, wherein said non-volatile memory is connected to said latch means only by a data line.

6. An option setting device for selectively setting conditions of a plurality of input/output circuits outputting a first signal having a value of 1 and a second signal having a value of 0 in accordance with an input signal, said option setting device including a plurality of option setting circuits, one option setting circuit provided for each input/output circuit, each said option setting circuit comprising:

a transistor provided in said input/output circuit to which said option setting circuit is provided;

a non-volatile memory storing option data only for said transistor, said option data showing whether said transistor is activated or disabled, said non-volatile memory storing said option data even after power is turned OFF, and said non-volatile memory outputting the option data when the power is turned ON; and a latch means, connected between said non-volatile memory and said transistor, for latching the option data supplied from the non-volatile memory when the power is turned ON and for supplying the latched data to the transistor while the power is ON.

7. An option setting device according to claim 6, wherein said non-volatile memory is connected to said latch means only by a data line.

8. An option setting circuit for selectively setting a condition of a plurality of circuits each outputting a first signal having a value of 1 and a second signal having a value of 0 in accordance with an input signal, said option setting circuit comprising:

a plurality of transistors, one transistor provided in each of the plurality of circuits;

a plurality of non-volatile memories, each memory associated with only one transistor of the plurality of transistors, each memory for storing option data only for said one transistor to which said memory is associated, said option data showing whether said one transistor is activated or disabled;

a plurality of latch means each connected between one said non-volatile memory and one said transistor, for latching the option data supplied from the non-volatile memory and for supplying the latched data to the transistor; and a plurality of switching means, each connected to one non-volatile memory, for supplying the option data of the non-volatile memory to the latch means when a power is turned on.

* * * * *